United States Patent
Gattere et al.

(10) Patent No.: US 10,771,042 B2
(45) Date of Patent: Sep. 8, 2020

(54) MICRO-ELECTRO-MECHANICAL DEVICE WITH REDUCED TEMPERATURE SENSITIVITY AND MANUFACTURING METHOD THEREOF

(71) Applicant: STMicroelectronics S.r.l., Agrate Brianza (IT)

(72) Inventors: Gabriele Gattere, Castronno (IT); Lorenzo Corso, Ruginello (IT); Alessandro Tocchio, Milan (IT); Carlo Valzasina, Gessate (IT)

(73) Assignee: STMicroeletronics S.r.l., Agrate Brianza (IT)

( * ) Notice: Subject to any disclaimer, the term of this patent is extended or adjusted under 35 U.S.C. 154(b) by 65 days.

(21) Appl. No.: 15/976,611

(22) Filed: May 10, 2018

(65) Prior Publication Data
US 2018/0342998 A1 Nov. 29, 2018

(30) Foreign Application Priority Data
May 25, 2017 (IT) .................. 102017000057094

(51) Int. Cl.
| H03H 9/02 | (2006.01) |
| H03H 9/24 | (2006.01) |
| H03H 3/007 | (2006.01) |
| H03H 9/46 | (2006.01) |
| H03H 9/05 | (2006.01) |

(52) U.S. Cl.
CPC ...... *H03H 9/02448* (2013.01); *H03H 3/0076* (2013.01); *H03H 9/02259* (2013.01); *H03H 9/02338* (2013.01); *H03H 9/2405* (2013.01); *H03H 9/2431* (2013.01); *H03H 9/2447* (2013.01); *H03H 2009/02322* (2013.01); *H03H 2009/02496* (2013.01)

(58) Field of Classification Search
CPC ............... H03H 9/02; H03H 9/46; H03H 9/05
USPC ......................................................... 333/186
See application file for complete search history.

(56) References Cited

U.S. PATENT DOCUMENTS

| 7,071,793 | B2 | 7/2006 | Lutz et al. |
| 7,806,586 | B2 | 10/2010 | Melamud et al. |
| 7,824,098 | B2 | 11/2010 | Melamud et al. |
| 9,431,993 | B1 | 8/2016 | Hsu et al. |
| 2004/0207489 | A1 | 10/2004 | Lutz et al. |
| 2007/0296526 | A1* | 12/2007 | Lutz .................. H03H 9/02259 333/186 |
| 2008/0204173 | A1 | 8/2008 | Melamud et al. |
| 2008/0218295 | A1* | 9/2008 | Lutz .................... H03H 3/0076 333/186 |
| 2009/0140443 | A1 | 6/2009 | Hohlfeld et al. |

(Continued)

OTHER PUBLICATIONS

Melamud et al., "Temperature-Insensitive Composite Micromechanical Resonators," *Journal of Microelectromechanical Systems* 18(6):1409-1419, Dec. 2009.

(Continued)

*Primary Examiner* — Dean O Takaoka
(74) *Attorney, Agent, or Firm* — Seed Intellectual Property Law Group LLP (57) ABSTRACT

A microelectromechanical device having a mobile structure including mobile arms formed from a composite material and having a fixed structure including fixed arms capacitively coupled to the mobile arms. The composite material includes core regions of insulating material and a silicon coating.

20 Claims, 6 Drawing Sheets

(56) References Cited

U.S. PATENT DOCUMENTS

2011/0127621 A1   6/2011  Kimura et al.
2012/0262026 A1  10/2012  Lin et al.
2014/0252509 A1   9/2014  Merassi
2014/0284603 A1   9/2014  Su et al.
2016/0169931 A1   6/2016  Tocchio
2017/0108530 A1   4/2017  Tocchio et al.
2018/0339898 A1* 11/2018  Gattere ................ H03H 9/2431

OTHER PUBLICATIONS

Hopcroft, "Temperature-Stabilized Silicon Resonators for Frequency References," Dissertation, Stanford University, Sep. 2007, 253 pages.

\* cited by examiner

Fig. 13

MICRO-ELECTRO-MECHANICAL DEVICE WITH REDUCED TEMPERATURE SENSITIVITY AND MANUFACTURING METHOD THEREOF

BACKGROUND

Technical Field

The present disclosure relates to a microelectromechanical device with reduced temperature sensitivity and to a manufacturing method thereof.

Description of the Related Art

As is known, frequency stability is a critical point for different types of microelectromechanical (MEMS) sensors and actuators, such as, for example, resonators, oscillators, accelerometers and gyroscopes. In fact, frequency stability for such MEMS devices is often related to the sensitivity of the device, and therefore the performance of same.

In particular, in new silicon-based MEMS oscillators it is desired to have a better frequency stability so that they exhibit characteristics comparable to those of established crystal oscillators.

In MEMS devices, the oscillation frequency depends on the Young's modulus according to the relation:

$$F_{MEMS} \propto \sqrt{E} \tag{1}$$

where $f_{MEMS}$ is the oscillation frequency and E is Young's modulus.

In turn, Young's modulus depends on the temperature according to the equation:

$$E(T) = E_0 \cdot (1 + TCE_1 \cdot \Delta T + TCE_2 \cdot \Delta T^2) \tag{2}$$

where $E_0$ is Young's modulus at $T_0 = 25°$ C., $TCE_1$ and $TCE_2$ ("Temperature Coefficient E", temperature coefficient of the Young's modulus) are a first and a second temperature coefficient, and $\Delta T$ is the considered temperature variation.

As temperature and, consequently, Young's modulus change, the oscillation frequency changes and this can be problematic because it may compromise the frequency stability of the device.

Known solutions to this problem include the use of highly doped single-crystal silicon (SCS) or an electronic compensation.

In particular, high doping levels allow changing the crystalline structure of the material since this causes the electronic bands to move, thus, changing the elastic properties of the material. However, this solution cannot be used if, for example, the structural layer is made of polysilicon.

The electronic compensation solution involves using adders that add a compensation component to the detection signal. However, in this case, there is a higher complexity of the circuit connected to the microelectromechanical device and a higher power consumption.

It is known from the article by Melamud et al., "Temperature-Insensitive Composite Micromechanical Resonators" (Journal of Microelectromechanical Systems, volume 18, number 6, December 2009) and from U.S. Pat. Nos. 7,824,098 and 7,806,586 that the dependency of frequency on temperature may be compensated by using a composite material, comprising a plurality of materials with different and opposite temperature coefficients, proposing a material comprising a silicon core and a silicon oxide coating.

Figure 1:
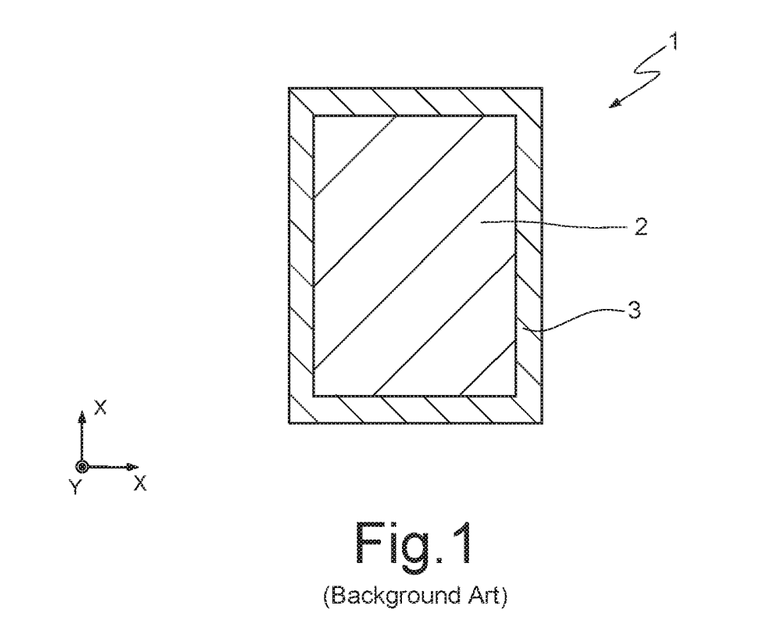
FIG. 1 shows a cross-section of a body of composite material of a known type.

This solution is schematically shown in FIG. 1, showing a cross section (in a plane XZ of a Cartesian coordinate system XYZ) of a body 1 that can be manufactured using semiconductor technology and comprises an inner region 2 of silicon, and an outer layer 3 of silicon oxide. Here, the outer layer 3 extends around the entire perimeter of the inner region 2 and is obtained by oxidizing the silicon inner region, once same has been defined.

This solution takes advantage of the fact that the outer layer 3, of silicon oxide, has a positive temperature coefficient that opposes the (negative) temperature coefficient of the inner region 2, of silicon. As a result, the frequency variations of the material forming the inner region 2 are compensated by the outer layer 3.

Figure 2:
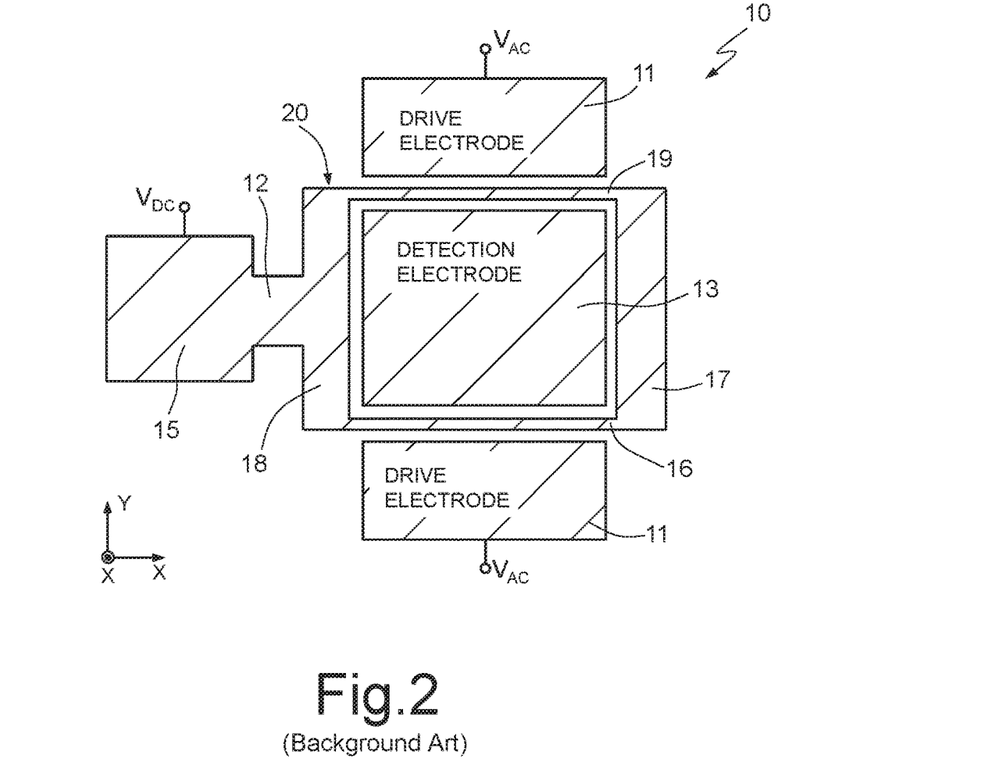
FIG. 2 shows a microelectromechanical device of a known type used to characterize the composite material in FIG. 1.

In the aforementioned article, the compensation capacity of the composite material in FIG. 1 is demonstrated in a MEMS device, shown in FIG. 2 and indicated using reference sign 10. In particular, the depicted MEMS device 10 is a flexural tuning-fork resonator that is closed at both ends (DEFT, "double-ended tuning fork").

The MEMS device 10 comprises a detection electrode 13 and two drive electrodes 11. The detection electrode 13 is electrically coupled to both of the drive electrodes 11.

The drive and detection electrodes 11, 13 are fixed and are, for example, rectangular when seen from above (parallel to the plane XY in the Cartesian coordinate system XYZ).

The drive and detection electrodes 11, 13 are capacitively coupled to a mobile structure 20, for example, of a hollow rectangular shape which and comprises two oscillation beams 16, 19 and two vertical arms 17, 18, arranged in opposing pairs and extending around the perimeter of the rectangular shape of the mobile structure 20.

The oscillation beams 16, 19 and the two vertical arms 17, 18 surround, at a distance, the detection electrode 13 around its perimeter. The oscillation beams 16, 19 are composite elements with the cross section shown in FIG. 1.

The structure 20 is carried by an anchor 15 via a connection element 12.

When in use, the drive electrodes 11 are biased by an alternating drive voltage $V_{AC}$, while the structure 20 is biased, via the anchor 15 and the connection element 12, by a direct bias voltage $V_{DC}$.

In this way, as a result of natural electrical forces, the oscillation beams 16, 19 vibrate along the direction Y at their oscillation frequency, and the distance between same and the detection electrode 13 varies periodically. The oscillation frequency of the oscillation beams 16, 19 is detected as a capacitive variation by the detection electrode 13.

This generates a corresponding output signal supplied to an external processing circuit (not shown) that is consequently able to determine the variation in the oscillation frequency as a function of temperature variation, on the basis of equations (1) and (2).

In this way, it is possible to detect the trend of the oscillation frequency as a function of the temperature variation.

Figure 3:
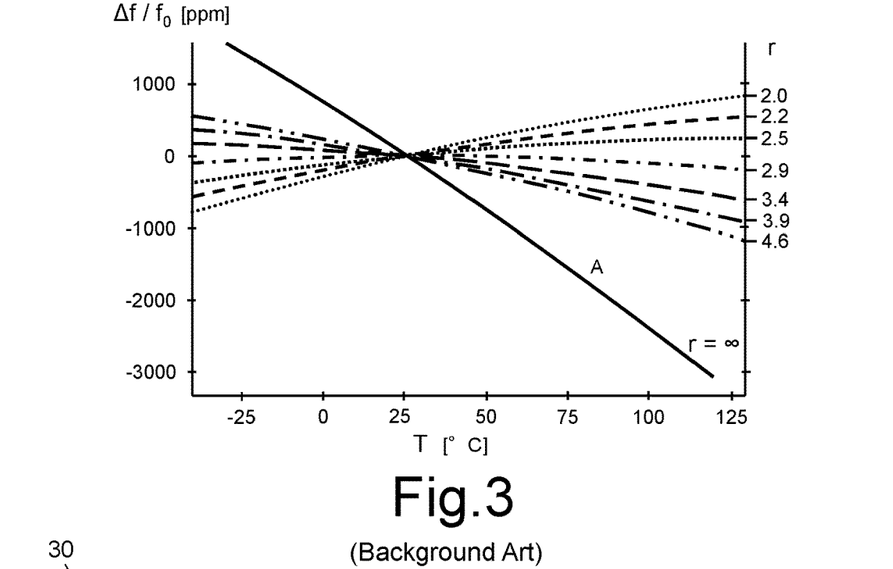
FIG. 3 shows the plot of a characteristic magnitude of the device in FIG. 2.

For example, FIG. 3 shows the trend of the relative frequency variation $\Delta f/f_0 = (f - f_0)/f_0$ as a function of the temperature in the MEMS device 10, oriented in the crystallographic direction [110] for different values of a nominal flexural ratio, indicated by the reference sign r, defined according to equation (3):

$$r = \frac{m_{Si}}{m_{SiO_2}} \frac{f_{Si}^2}{f_{SiO_2}^2} \tag{3}$$

in which $m_{Si}$ is the mass of silicon, $m_{SiO2}$ is the mass of silicon oxide, $f_{Si}$ is the natural oscillation frequency of silicon and $f_{SiO2}$ is the natural oscillation frequency of silicon oxide.

In FIG. 3, the curve A refers to a MEMS device 10 made of pure silicon.

As can be seen, the presence of the silicon oxide outer layer 3 makes it possible to significantly reduce the temperature dependency and the achievable improvement depends on the nominal flexural ratio r.

Despite the optimum capacity of the composite material in FIG. 1 to compensate for the variation in frequency as a function of the temperature, the presence of an outer layer of silicon oxide may cause a number of problems.

In particular, such problems may relate to reliability issues, since the outer layer of silicon oxide may reduce the robustness of the device against impacts.

Furthermore, the geometric characteristics of structures made in this way (for example the distance between the electrodes 11, 13 in FIG. 2, or the dimensions of the springs in other devices) are modified in a non-uniform manner and are not always perfectly predictable as a result of the presence of the outer layer itself, which is obtained by thermal growth, adversely affecting the performance of the device. In particular, the variability of the distance between the electrodes can be expressed as the variance $\sigma_g$ given by (4):

$$\sigma_g = \sqrt{\sigma_t^2 + \sigma_{ox}^2} \quad (4)$$

in which $\sigma_t$ is the variance in the width of the lithographic trench between two adjacent silicon elements before the oxidation process and $\sigma_{ox}$ is the variance in the layer of silicon oxide resulting from the oxidation process.

Adding the layer of silicon oxide introduces a further variability term which reduces the performance of the device.

Furthermore, in the case of inertial devices such as accelerometers, the presence of the layer of silicon oxide increases the risk of stiction, impeding the correct operation of the device.

BRIEF SUMMARY

The present disclosure is intended to provide a microelectromechanical device and a related manufacturing method that address drawbacks in the prior art.

The present disclosure provides for a microelectromechanical device with reduced temperature sensitivity and a related manufacturing method.

BRIEF DESCRIPTION OF THE SEVERAL VIEWS OF THE DRAWINGS

The present disclosure is further described below with reference to preferred embodiments thereof, which are provided purely as non-limiting examples, and to the attached drawings, wherein.

DETAILED DESCRIPTION

Figure 4:
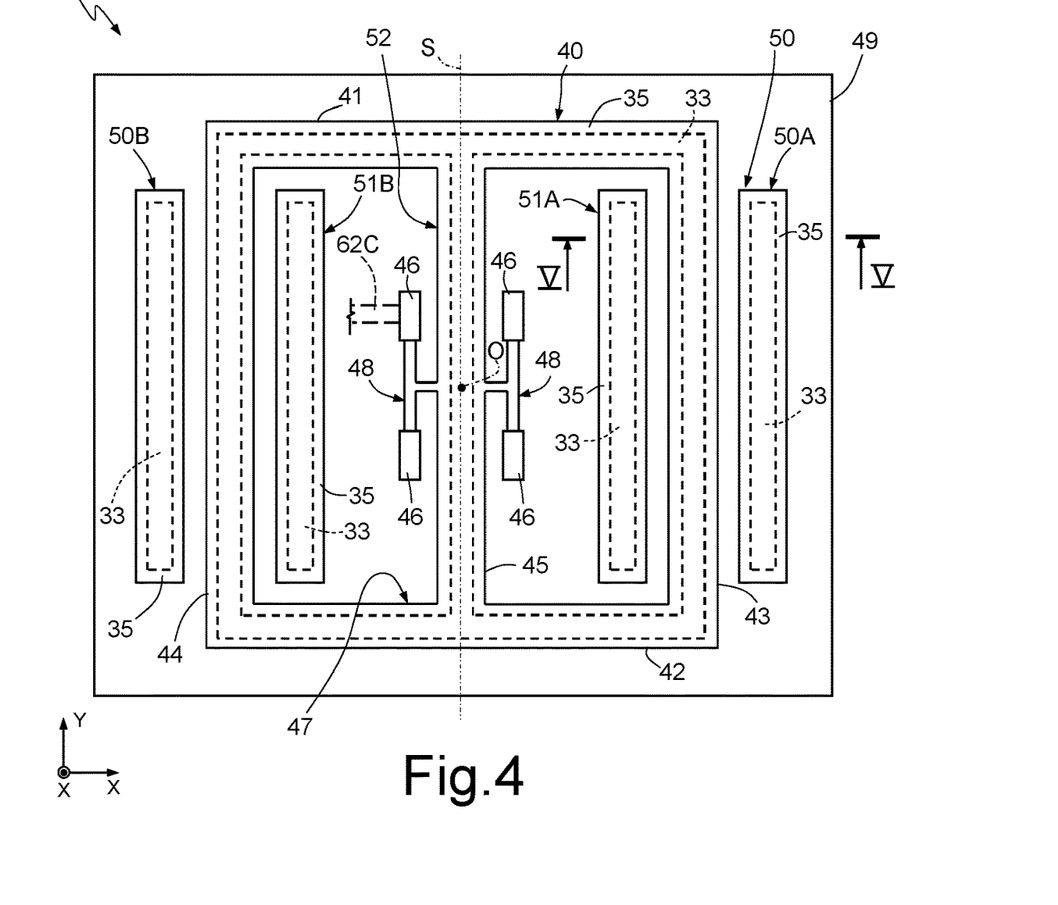
FIG. 4 is a simplified top view with ghost portions of a microelectromechanical device according to one embodiment of the present disclosure.

FIG. 4 shows a microelectromechanical device 30 (hereinafter also referred to as device 30). In particular, a MEMS device forming a microelectromechanical resonator is described below as an example. Nonetheless, the solution to which the present application relates applies to various types of MEMS devices, for example inertial devices such as accelerometers and gyroscopes. The disclosure described herein is therefore not limited to the specific device illustrated.

The device 30 comprises a mobile structure 40 and a fixed structure 50.

The mobile structure 40 is suspended above a supporting layer 49 (shown schematically in FIG. 4 and in greater detail in FIG. 5) of the device 30 and extends primarily in a horizontal plane XY of a Cartesian coordinate system XYZ.

The mobile structure 40 is made up of a first and a second flexing arm 43, 44 and by a first and a second transverse connecting element 41, 42. The flexing arms 43, 44 are parallel to one another and extend primarily lengthwise, in the example shown herein, parallel to a first horizontal axis Y of the Cartesian coordinate system XYZ.

The first and the second flexing arms 43, 44 are connected at a first end thereof by the first transverse connecting element 41, extending parallel to a second horizontal axis X, and at a second end thereof by the second transverse connecting element 42, which also extends parallel to the second horizontal axis X. In practice, the flexing arms 43, 44 and the transverse connecting elements 41, 42 extend along the sides of a quadrilateral, in this case a rectangle, and inwardly define a window 47 that is substantially rectangular in the horizontal plane XY.

The mobile structure 40 is suspended above the supporting layer 49 by a suspension structure 52 that includes a suspension arm 45. The latter is centrally arranged inside the window 47 and extends parallel to the first horizontal axis Y and to the first and second flexing arms 43, 44, from a central portion of the first transverse connecting element 41 to a corresponding central portion of the second transverse connecting element 42.

The suspension structure 52 also comprises herein a plurality of mobile anchors 46 arranged inside the window 47 and rigidly connected to the supporting layer 49. Furthermore, the suspension structure 52 comprises herein connection elements 48 that are also arranged inside the window 47, rigidly connecting the suspension arm 45 to the mobile anchors 46.

The mobile anchors 46 are, for example, pillar or column elements extending along a vertical axis Z of the reference system XYZ between the supporting layer 49 and the plane of the mobile structure 40 and of the fixed structure 50. Each connection element 48 is T-shaped and extends between the central portion of the suspension arm 45 and a respective pair of mobile anchors 46.

The fixed structure 50 is capacitively coupled to the mobile structure 40 in the horizontal plane XY and comprises a first and a second actuating electrode 50A, 50B and a first a second detection electrode 51A, 51B. The first and the second actuating electrodes 50A, 50B are arranged facing and parallel to the first and second flexing arms 43, 44, respectively, externally to the mobile structure 40 and the window 47. The first and the second detection electrodes 51A, 51B are arranged inside the window 47, facing and parallel to the first and second flexing arms 43, 44 respectively, internally to the same mobile structure 40.

In practice, as clearly shown in FIG. 4, the structure of the device 30 is symmetrical with respect to an axis of symmetry S passing through a barycenter O of the device 30.

Figure 5:
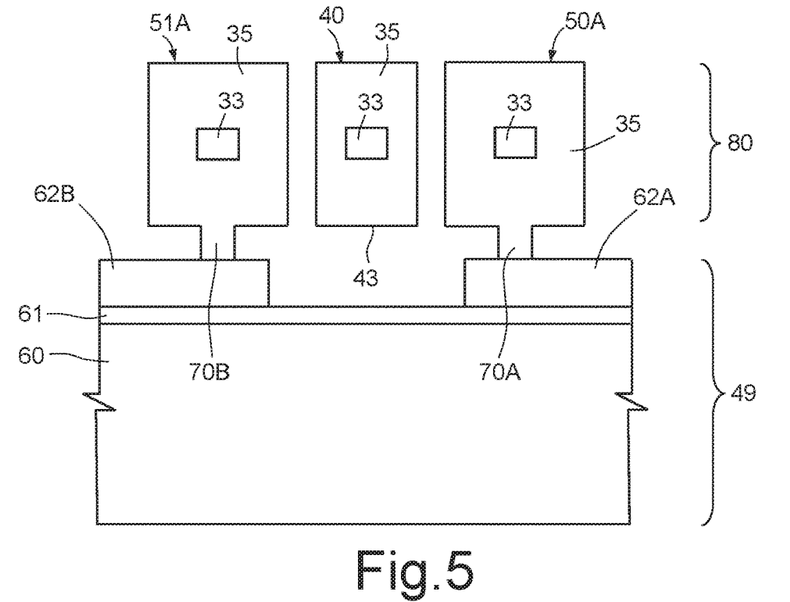
FIG. 5 is a cross-sectional view of the present device of FIG. 4 taken along a plane indicated by lines V-V in FIG. 4.

The actuating electrodes 50A, 50B and the detection electrodes 51A, 51B are anchored to the supporting layer 49 by means of respective fixed anchoring elements, for example shaped as columns or pillars, as shown in the cross section in FIG. 5. In this case, a first a second fixed anchoring element 70A, 70B extend from the supporting layer 49 and are electrically coupled to electrical connection lines 62A, 62B, made of polycrystalline silicon, extending above a substrate 60 and being electrically insulated from same by a first insulating layer 61. In detail, the first fixed anchoring element 70A extends between a respective actuating electrode 50A and a respective electrical connection line 62A and the second fixed anchoring element 70B extends between a respective detection electrode 51A and a respective electrical connection line 62B to bias the actuating electrodes 50A, 50B and the detection electrodes 51A, 51B. Similar electrical connection lines 62C (shown schematically using a dotted line in FIG. 4) extend across the substrate 49 and are electrically coupled to the mobile anchors 46 to bias the mobile structure 40.

In the embodiment described herein, the mobile structure 40, the suspension arm 45, the actuating electrodes 50A, 50B and the detection electrodes 51A, 51B are made of a composite material. In particular and as shown using the dotted line in FIG. 4 and in the cross section of a portion of the device 30 in FIG. 5, these are formed by a core region 33 made of an insulating material, for example silicon oxide, and by a silicon coating layer 35. In particular, the coating layer 35 completely surrounds the core region 33 so that the latter is not exposed at any point.

In the design phase, the dimensions of the core region 33 and of the coating layer 35 are studied in order to obtain the desirable electrical and mechanical characteristics for the device 30.

In particular, in the solution described herein, the dependency of the frequency on the temperature is minimized by adjusting the dimensional ratios between the thicknesses of the coating layer 35 and of the core region 33.

In fact, considering equation (2), it is possible to calculate a value of the thickness of the core region 35, defined here as $t_{ox}$, that minimizes the dependency of the frequency on the temperature in consideration of equation (5), as given in the text of Diana and Cheli, "Dinamica e vibrazione dei sistemi meccanici" ("Dynamics and vibration in mechanical systems", 2003, UTET Università, 10th reprint, page 255) and applied herein to the flexing arms 43, 44:

$$f_r = \frac{\beta}{2\pi}\sqrt{\frac{\sum B_i}{m}} = \frac{\beta}{2\pi}\sqrt{\frac{\sum E_i(T) \cdot I_i}{\sum A_i \cdot \rho_i}} \tag{5}$$

in which $f_r$ is the resonant frequency of the device 30; β is a constant of a mode of vibration obtained as reported in the aforementioned text by Diana and Cheli regarding transverse oscillation of beams; m is the mass of each flexing arm 43, 44; i refers to each material (silicon and oxide) of the composite layer 80; $B_i$ is a coefficient equal to the product of the Young's modulus $E_i$ and the moment of inertia $I_i$ of the section of each flexing arm 43, 44; $\rho_i$ is the density of each material; and $A_i$ is the section of each flexing arm 43, 44.

As is known, for the first mode of vibration, the moment of inertia $I_i$ is expressed as per (6):

$$I_i = \frac{1}{12}t_{ox}w_{ox}^3 \tag{6}$$

in which $t_{ox}$ and $w_{ox}$ are the thickness and the width of the core region 33, respectively.

Therefore, it is seen that, by varying the thickness $t_{ox}$ of the core region 33, it is possible to minimize the dependency of the resonant frequency $f_r$, and therefore of the oscillation frequency, on the temperature.

With reference to the coating layer 35, its thickness is studied during the design phase to ensure that the entire core region 33 is covered. For example, the thickness of the coating layer 35 may be greater than 2 μm, such as to enable certain process parameters to be taken into account, such as a possible misalignment of the masks (for example of 0.5 μm), a possible overetching during definition of the shape of the mobile structure 40 (for example of 1 μm) and the tolerance in the process phase (for example of 0.5 μm).

When in use, application of a suitable bias voltage between the actuating electrodes 50A, 50B and the mobile structure 40 causes a deforming antiphase movement, through bending, of the related first and second flexing arms 43, 44 in opposite directions along the second horizontal axis X, at the desired oscillation frequency.

The resulting movement of the first or second flexing arm 43, 44 towards or away from the first or second detection electrode 51A, 51B respectively causes a variation in the capacitive coupling between same and the generation of an associated electrical signal at the oscillation frequency, which may then be detected and processed or used by an electronic circuit (not shown herein) associated with the device 30.

The manufacturing phases of the device 30 in FIGS. 4 and 5 are shown in FIGS. 6 to 12.

Figure 6:
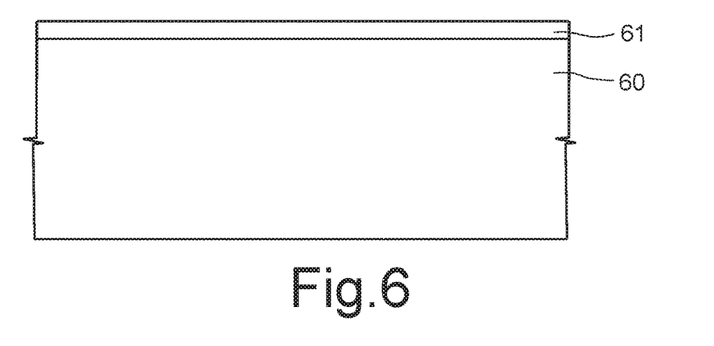
FIGS. 6 to 12 are cross-sectional views similar to FIG. 5 during successive manufacturing phases of the present device of FIG. 4 according to one embodiment of the present disclosure.

With reference to FIG. 6, the first insulating layer 61, which is for example made of silicon oxide, is thermally grown on the substrate 60, which is for example made of single-crystal silicon.

Figure 7:
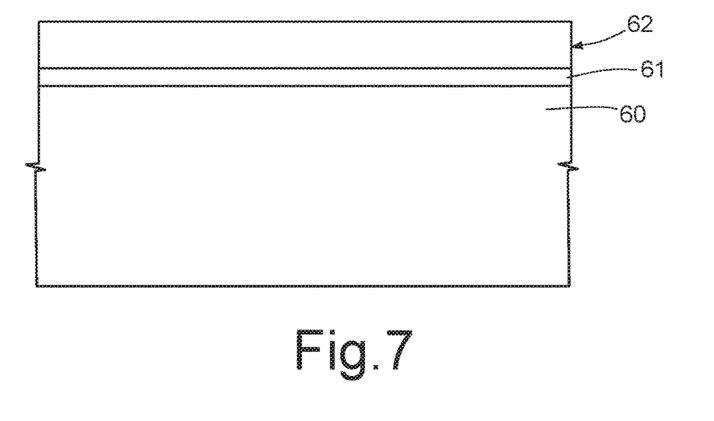

As shown in FIG. 7, a conductive layer 62, which is for example made of polycrystalline silicon, is deposited on the first insulating layer 61, for example using Low Pressure Chemical Vapor Deposition (LPCVD). The conductive layer 62 is then defined, for example by wet etching or using anisotropic etching techniques such as Deep Reactive Ion Etching (DRIE) in order to form the electrical connection lines 62A, 62B, 62C.

Figure 8:
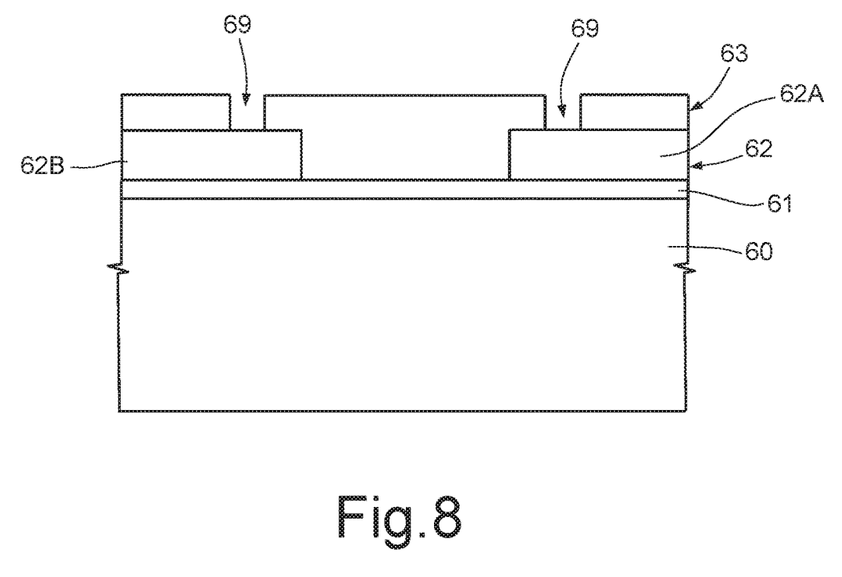

Subsequently, as shown in FIG. 8, a sacrificial layer 63 made of insulating material such as Tetra Ethyl Ortho Silicate (TEOS) is deposited using known techniques. The sacrificial layer 63 is then shaped using known photolithography techniques to remove the same at the anchoring zones of the overlying structures (in this case, the fixed anchors 70A, 70B), thus forming openings 69 above the electrical connection lines 62A, 62B, 62C.

Figure 9:
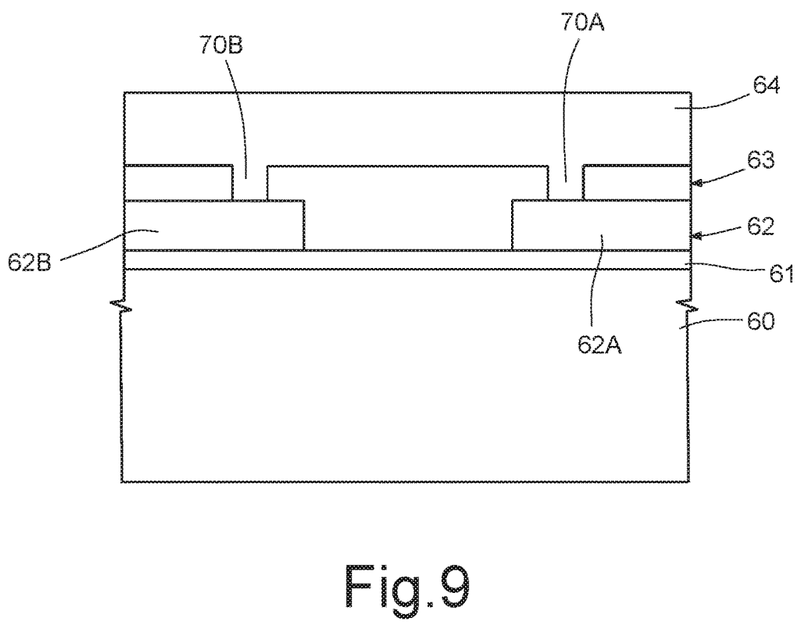

As shown in FIG. 9, a first epitaxial layer 64 of polycrystalline silicon is then grown on the sacrificial layer 63, extending over the entire surface of the sacrificial layer 63 and filling the openings 69. The fixed anchors 70A, 70B for the fixed structure 50 and the lower portions of the mobile anchors 46 of the mobile structure 40 and of the suspension arm 45 (not shown here) are thus formed. The thickness of the first epitaxial layer 64 may be, for example, of 3 µm.

The epitaxial layer 64 is then planarized using known techniques, such as Chemical Mechanical Polishing (CMP).

Figure 10:
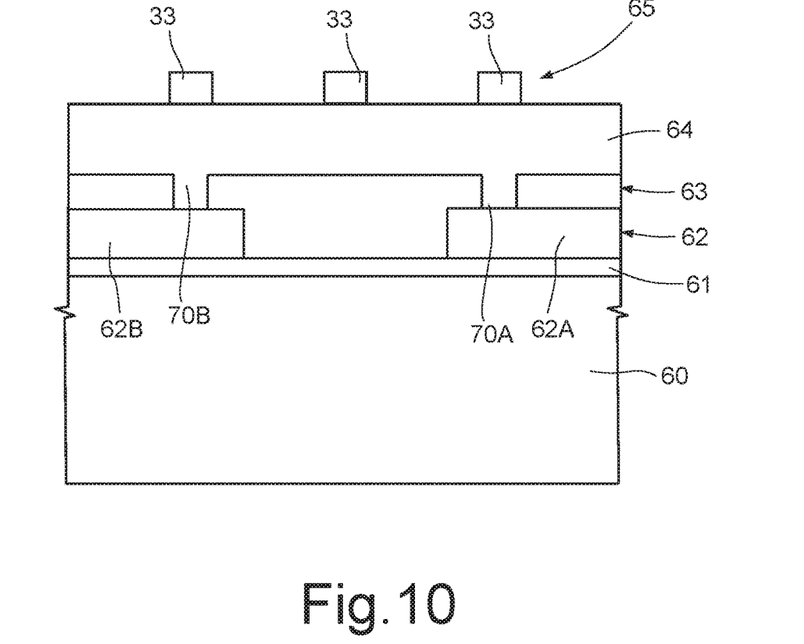

As shown in FIG. 10, a second insulating layer 65 of silicon oxide is uniformly deposited on the first epitaxial layer 64 and to a thickness, for example, of 4 µm. The second insulating layer 65 is then defined using known photolithography techniques, in order to form the core regions 33.

Figure 11:
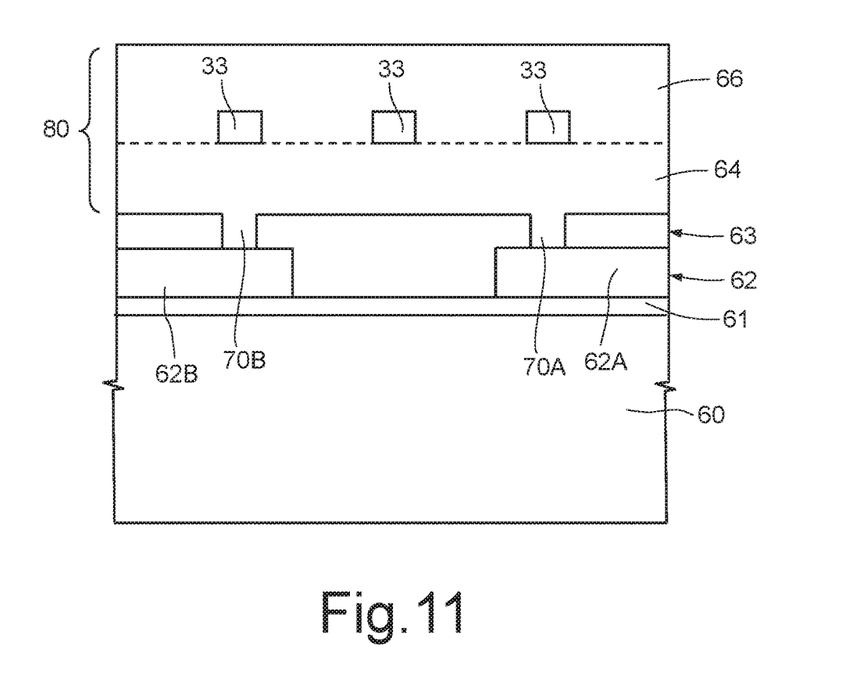

As shown in FIG. 11, a second epitaxial layer 66 of polycrystalline silicon is then grown. In practice, this results in forming a composite layer 80 made up of the first epitaxial layer 64 and the second epitaxial layer 66 (which are generally indistinguishable and shown separated by a dotted line only in FIG. 11, for demonstration purposes), with the core regions 33 embedded therein is formed.

The second epitaxial layer 66 is then planarized using known techniques, so that it has a thickness, for example, of 3 µm. Consequently, the total thickness of the composite layer 80 is for example 10 µm.

Figure 12:
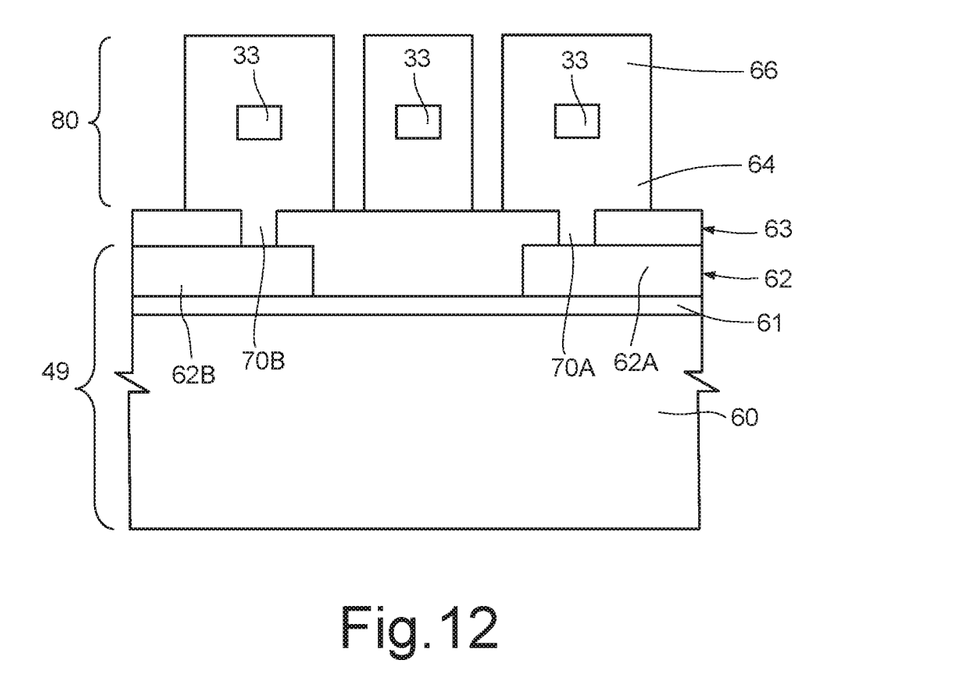

Subsequently, as shown in FIG. 12, the composite layer 80 is defined using anisotropic etching techniques, such as DRIE, forming the mobile structure 40, the suspension structure 52 and the fixed structure 50, of which FIG. 12 shows the actuating electrode 50A, the detection electrode 51A and the first flexing arm 42. The definition process is such that the etching does not uncover the silicon oxide core regions 33, which, as a result, are completely surrounded by the polycrystalline silicon of the epitaxial layers 64, 66.

Finally, the sacrificial layer 63 is removed, for example using known chemical etching techniques, thereby freeing the mobile structure 40 and the suspension structure 52 and obtaining the structure in FIG. 5.

After the final phases of manufacture, including the creation of metal connections, pads, etc., as known to the person skilled in the art, the wafer thus worked is cut to obtain a plurality of devices of the type of the device 30, as shown in FIGS. 4 and 5.

The device 30, as indicated, is a resonator that can be incorporated into an electronic apparatus 100 (FIG. 13), that includes an application circuit 131, that is designed to execute one or more applications that require a timing from a clock signal ck, and a timing circuit 132 designed to provide the clock signal ck to the application circuit 131.

Figure 13:
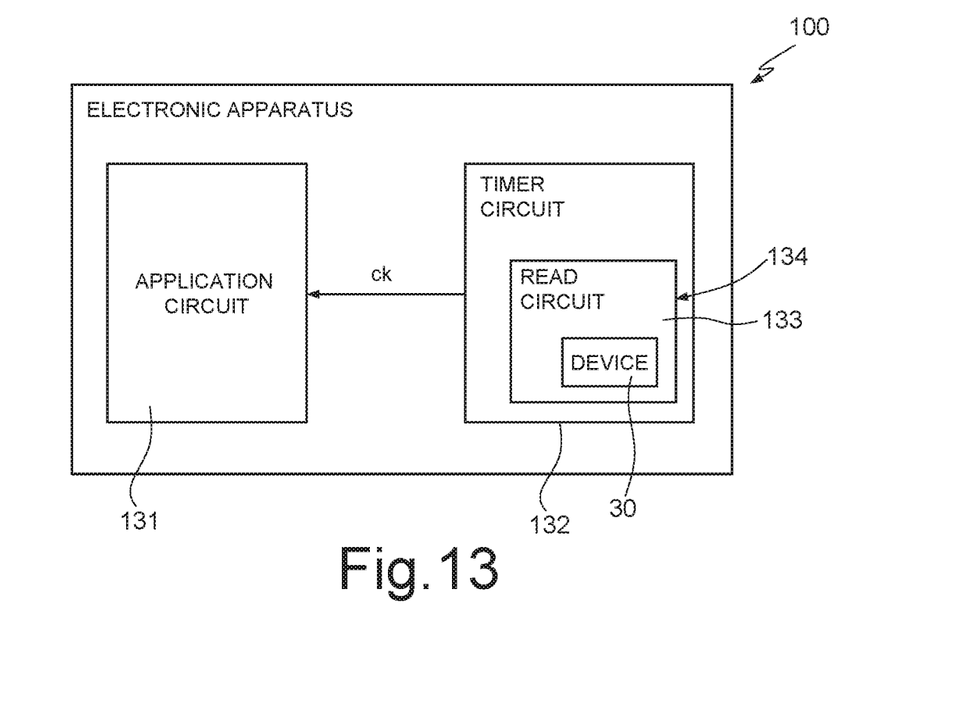
FIG. 13 is a block diagram of an electronic device incorporating the present microelectromechanical device of FIG. 4 according to another embodiment of the present disclosure.

The timing circuit 132 includes the device 30, discussed above, and a related electronic reading circuit 133 that can advantageously be integrated into the device 30 in a single die 134 made of semiconductor material.

The advantages of the present disclosure are clear from the foregoing.

In particular, the ability to make microelectromechanical structures from a composite material formed by a core of silicon oxide and a coating of polycrystalline silicon, having opposite temperature coefficients, allows to obtain MEMS devices with an high stability in frequency as a function of the temperature.

The fact that the outer layer of the composite material is silicon and that this material constitutes most of the volume of the structures of the microelectromechanical device created ensures that the mechanical characteristics of said device, in particular reliability and shock resistance, are substantially the same as for pure silicon. Furthermore, given that the silicon layer is external, the MEMS device has high impact resistance, with no adverse effect on performance compared to devices made of composite material with a silicon core and a coating of insulating material.

Furthermore, since the geometric configuration of the structure is not modified after its photolithographic definition, the dimensional variability, and in particular the distance between the mobile and fixed elements, depends only on the tolerances of the definition process for the structures, there being no other contributing factors.

The fact that the silicon and silicon oxide portions are obtained by deposition and definition, instead of by definition and oxidation, allows improving the flexibility of the manufacturing method, for example in terms of thermal budget, thereby improving the reliability of the finished device.

Consequently, the present solution provides MEMS devices having very predictable, optimum frequency behavior.

It is evident that modifications and variations may be made to the device and method described and illustrated herein without thereby departing from the scope of the present disclosure, as defined in the attached claims.

For example, the composite material may be used for the mobile structure 40 only. In this case, the second insulating layer 65 is removed in the zone designed to form the suspension structure 52 and the fixed structure 50 during the definition process in FIG. 10.

The MEMS device 30, as indicated, may be of any type where frequency stability with temperature is desired, as, for example, in inertial devices such as accelerometers and gyroscopes, as well as in the described resonator.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A microelectromechanical device, comprising:
   a resonator that includes:
   a mobile structure having a core region of a first material and a second material on the core region, the mobile structure including:
   mobile arms extending in a first direction,
   connecting elements connected to the mobile arms and extending in a second direction that is transverse to the first direction;
   a window extending through the mobile arms and the connecting elements;
   a suspension arm coupled to the connecting elements, the suspension arm extending across the window in spaced relationship with the mobile arms;
   at least one anchor coupled to the suspension arm, the at least one anchor positioned inside the window; and
   a fixed structure coupled to the mobile structure, the fixed structure including at least one actuating electrode and at least one detection electrode that are capacitively coupled to one of the mobile arms, one of the at least one actuating electrode and one of the at least one detection electrode being arranged inside the window and the other one of the at least one actuating electrode and the other one of the at least one detection electrode being arranged outside the window.

2. The microelectromechanical device according to claim 1, wherein the first material is silicon oxide.

3. The microelectromechanical device according to claim 2, wherein the fixed structure includes the first material and the second material on the first material.

4. The device of claim 1, wherein the at least one actuating electrode includes a first actuating electrode and a second actuating electrode and the at least one detection electrode includes a first detection electrode and a second detection electrode, the first actuating electrode and the second actuating electrode positioned outside the quadrilateral and the first detection electrode and the second detection electrode positioned inside the quadrilateral.

5. The microelectromechanical device of claim 1 wherein the suspension arm has a first side and a second opposite the first side, the at least one anchor including a first anchor and a second anchor, the first anchor coupled to the first side of the suspension arm and the second anchor coupled to the second side of the suspension arm.

6. The microelectromechanical device according to claim 1, wherein the at least one anchor includes two anchors, the microelectromechanical device further comprising:
a connection element coupled to the suspension arm and each of the two anchors.

7. The microelectromechanical device according to claim 1 further comprising:
a substrate, the substrate having a first surface, the mobile structure and the fixed structure extending over the first surface of the substrate;
a first insulating layer on the first surface of the substrate, the first insulating layer having a second surface spaced from the first surface of the substrate; and
a plurality of electrical connection lines on the second surface of the first insulating layer and electrically coupled to the mobile and fixed structures.

8. An electronic apparatus, comprising:
a timing circuit configured to generate a clock signal, the timing circuit including a microelectromechanical device including:
a mobile structure including:
mobile arms having a composite structure including an insulating material and a coating material that completely surrounds the core region;
connecting elements coupled to the mobile arms; and
a window;
a suspension arm in the window and coupled to each of the connecting elements, the suspension arm having a first side and a second side opposite the first side;
a first pair of anchors coupled to the first side of the suspension arm;
a second pair of anchors coupled to the second side of the suspension arm; and
a fixed structure including an actuating electrode and a detection electrode electrically coupled to one of the mobile arms, one of the actuating electrode and the detection electrode being in the window of the mobile structure and the other one of the actuating electrode and the detection electrode being outside the window of the mobile structure; and
an application circuit coupled to the timing circuit to receive the clock signal.

9. The electronic apparatus of claim 8, wherein the insulating material is silicon oxide and the coating material is silicon.

10. The electronic apparatus of claim 9, wherein the fixed structure has the composite structure including silicon oxide and silicon.

11. The electronic apparatus of claim 8, wherein the mobile arms of the mobile structure are a pair of mobile arms and the connecting elements of the mobile structure are a pair of connecting arms connected to the pair of mobile arms around a quadrilateral perimeter of the mobile structure, the window being a quadrilateral window.

12. The electronic apparatus of claim 11, wherein the actuating electrode is one of a pair of actuating electrodes and the detection electrode is one of a pair of detection electrodes, the pairs of actuating and detection electrodes being capacitively coupled to the pair of mobile arms, wherein each of the detection electrodes is positioned in the quadrilateral window and each of the actuation electrodes is positioned outside the quadrilateral window.

13. The electronic apparatus of claim 12, further comprising:
a substrate; and
a plurality of connection elements, a first one of the plurality of connection elements coupled to the suspension arm and each of the first pair of anchors and a second one of the plurality of connection elements coupled to the suspension arm and each of the second pair of anchors.

14. The electronic apparatus of claim 13, wherein the substrate includes a pair of electrical connection lines electrically coupled to the actuating electrodes.

15. A microelectromechanical device, comprising:
a substrate;
a mobile structure coupled to the substrate including:
a pair of flexible arms; and
a pair of connecting elements coupled to the pair of flexible arms around a window;
a suspension arm coupled to each connecting element of the pair of connecting elements, at least one of flexible arm of the pair of flexible arms and the suspension arm have a composite structure including a core region including a first material and a coating layer on the core region including a second material different than the first material;
a plurality of anchors in the window;
a connection element in the window and coupled to two anchors of the plurality of anchors and the suspension arm;
a first detection electrode coupled to the substrate and positioned inside the window; and
a first actuating electrode coupled to the substrate and positioned outside the window, wherein a first one of the flexible arms is capacitively coupled to the first actuating electrode and the first detection electrode.

16. The microelectromechanical device of claim 15, wherein the suspension arm is positioned centrally with respect to the pair of flexible arms and the pair of connecting elements.

17. The microelectromechanical device of claim 15, wherein the suspension arm includes a first side and a second side, the plurality of anchors including a first anchor on the first side of the suspension arm and a second anchor on the second side of the suspension arm.

18. The microelectromechanical device of claim 17, further comprising:
a second detection electrode coupled to the substrate and positioned inside the window; and
a second actuating electrode coupled to the substrate and positioned outside the window, wherein a second one of the flexible arms is capacitively coupled to the second actuating electrode and the second detection electrode.

19. The microelectromechanical device of claim 18, wherein the first detection electrode is on the first side of the suspension arm and the second detection electrode is on the second side of the suspension arm.

20. The microelectromechanical device of claim 15, further comprising:
an insulating layer on the substrate; and
an electrical connection line on the insulating layer connected to the first actuating electrode.

* * * * *

UNITED STATES PATENT AND TRADEMARK OFFICE
CERTIFICATE OF CORRECTION

PATENT NO. : 10,771,042 B2
APPLICATION NO. : 15/976611
DATED : September 8, 2020
INVENTOR(S) : Gabriele Gattere et al.

Page 1 of 1

It is certified that error appears in the above-identified patent and that said Letters Patent is hereby corrected as shown below:

On the Title Page

Item (73) Assignee:
"STMicroeletronics S.r.l." should read --STMicroelectronics S.r.l.--.

Signed and Sealed this
First Day of December, 2020

Andrei Iancu
*Director of the United States Patent and Trademark Office*